(12) United States Patent
Chuang

(10) Patent No.: US 6,190,958 B1
(45) Date of Patent: Feb. 20, 2001

(54) FULLY SELF-ALIGNED METHOD FOR FABRICATING TRANSISTOR AND MEMORY

(75) Inventor: Shu-Ya Chuang, Hsinchu Hsien (TW)

(73) Assignee: United Semiconductor Corp., Hsinchu (TW)

( * ) Notice: Under 35 U.S.C. 154(b), the term of this patent shall be extended for 0 days.

(21) Appl. No.: 09/293,430

(22) Filed: Apr. 16, 1999

(30) Foreign Application Priority Data

Mar. 8, 1999 (TW) .................................................. 88103507

(51) Int. Cl.[7] .............................................. H01L 21/8242
(52) U.S. Cl. ............................................ 438/241; 257/300
(58) Field of Search .................................. 438/241, 253, 438/258, 266; 257/296, 300, 303, 390

(56) References Cited

U.S. PATENT DOCUMENTS 5,955,768 * 9/1999 Liaw et al. ........................... 257/383

* cited by examiner

Primary Examiner—David Nelms
Assistant Examiner—Quoc Hoang
(74) Attorney, Agent, or Firm—Jiawei Huang; J C Patents

(57) ABSTRACT

A fully self-aligned method for fabricating a transistor is described. The source/drain contact opening is formed in the forming step of the gate to avoid the problem of misalignment. Therefore, the complex processes and the poly pad layer of the conventional method are not needed. A fully self-aligned method for fabricating memory is described. The memory cell and logic circuit regions have the same height during the formation process of the memory.

19 Claims, 12 Drawing Sheets

FULLY SELF-ALIGNED METHOD FOR FABRICATING TRANSISTOR AND MEMORY

CROSS-REFERENCE TO RELATED APPLICATION

This application claims the priority benefit of Taiwan application serial no. 88103507, filed Mar. 8, 1999, the full disclosure of which is incorporated herein by reference.

BACKGROUND OF THE INVENTION

1. Field of the Invention

The invention relates in general to the fabrication of forming a transistor and a memory, and more particularly to a fully self-aligned method for fabricating a transistor used to manufacture a dynamic random access memory (DRAM).

2. Description of the Related Art

Transistors are the most widely used semiconductor device in integrated circuits. A transistor is usually used as a digital switch for logic circuits and memory devices.

Memory, the semiconductor device for storing information and data, has various types as follows: mask read only memory (Mask ROM), programmable read only memory (PROM), erasable programmable read only memory (EPROM), electrically erasable programmable read only memory (EEPROM), flash memory, static random access memory (SRAM) and dynamic random access memory (DRAM). DRAM is a type of high-density integrated circuit on a silicon chip widely used in the electronic industry for storing digital information.

FIG. 1 is a schematic, cross-sectional view showing a DRAM cell. Referring to FIG. 1, a DRAM cell is composed of a gate 101, source/drain regions 105 and 107, and a contact pug 109 of the source/drain region for contacting bit lines 111 and capacitor 103. The source/drain region 105 and bottom electrode 115 of the capacitor 103 contact each other. There are no contact regions between the staggered word line 113 and bottom electrode 115. If the capacitor 113 is formed below the bit line 111, then it is called a bit line over capacitor (BOC). If the capacitor 113 s formed above the bit line 111, then it is called a capacitor over bit line (COB). The semiconductor manufacturers try to improve the shape and size of the capacitor for increasing capacitance of the capacitor. The COB device is widely accepted by manufacturers as a way to form different capacitor shapes in a designated space. FIGS. 2A to 2D are schematic, cross-sectional views showing the conventional method for manufacturing a DRAM capacitor. Referring to FIG. 2A, a substrate 202 having gates 204, 206, 208 and 210, and source/drain regions 212, 214 and 216, is provided, wherein the gates are covered by spacer 218. A dielectric layer 220 is then formed on the surface of the entire substrate 102, through a chemical vapor deposition process, to a thickness of from 500 Å to 2000 Å (angstrom).

Next, referring to 2B, contact openings 222 and 224 for the source/drain regions are formed in the dielectric layer 220, exposing surfaces of the substrate 202 by a conventional photolithography process for removing portions of the dielectric layer 220 with respect to contact openings.

Thereafter, referring to 2C, a conductive layer 230, formed of polysilicon or tungsten silicide, is formed on the substrate 202 and fills the contact opening 222 and 224 to form conductive plugs 226 and 228 by a chemical vapor deposition. A bit line is formed after the processes of photolithography and etching. A dielectric layer 232, composed of silicon oxide, is formed on the substrate 202 by a chemical vapor deposition.

Referring to FIG. 2D, photolithography and etching processes are used to remove the dielectric layers 220 and 232 located above the source/drain region 214 in sequence for forming a contact opening 233 to expose source/drain regions 214. Another conductive layer 234, a bottom electrode of the capacitor, is then formed on the dielectric layer 232 and fills the contact opening 233 to electrically contact the source/drain region 214. Dielectric layer 236 and top electrode 238 of the capacitor can be formed in the subsequent processes to complete the manufacture of the DRAM cell. The conductive layers 234 and 230 are staggered with respect to each other and have no electrical contact.

The conventional method described above has the drawback of shifting of the contact opening caused by the misalignment of the photolithography process due to the process sequence of forming gates followed by the formation of the contact openings of the source/drain regions. The shifting of the contact opening minimizes the contact areas between the plug and substrate and raises the resistance. FIG. 6 is a schematic, cross-sectional view showing a partial enlargement of the plug 226 shown in FIG. 2D. The contact areas between the plug 226 and source/drain region 216 is shrunk because of a misalignment; hence the resistance is raised.

Furthermore, a poly pad with large surface is utilized in other conventional method for increasing the contact areas. FIG. 7 is a schematic, cross-sectional view showing the structure of a conventional poly pad. Referring to FIG. 7, the poly pad is used to increase the contact areas of the plug 226 for solving the problem of misalignment. However, the additional poly pad complicates the manufacturing processes and increases the cost.

SUMMARY OF THE INVENTION

The invention provides a fully self-aligned method for fabricating a transistor. The source/drain contact opening is formed in the formation step of the gate to avoid the problem of misalignment. Therefore, the complex processes and the poly pad layer of the conventional method are not needed.

The invention provides a fully self-aligned method for fabricating memory. The memory cell and logic circuit regions have the same height during the formation process of the memory.

The invention also provides a fully self-aligned method for fabricating a transistor. The method comprises the steps of providing a semiconductor substrate, then subsequently forming a first dielectric layer on the substrate. After that, a plurality of source/drain region contact openings and word line trenches are formed on the first dielectric layer simultaneously by patterning the first dielectric layer. A doped conductive layer is formed in the source/drain contact openings and word line trenches to form a plurality of source/drain conduct plugs and first gate conductive layers, respectively. Thereafter, the first gate conductive layers are removed to expose the substrate. A thermal oxidation is performed to form a gate oxide layer on the exposed substrate and to form a plurality of source/drain regions at the interface between the source/drain contact openings and substrate. A second conductive layer is formed in the word line trenches to form a plurality of second gate conductive layers on the gate oxide layer, wherein the second gate conductive layers have a height less than a depth of the word line trenches. Thereafter, an insulation layer is formed on the substrate and filling the word line trenches.

The invention provides a fully self-aligned method for fabricating memory. The method comprises the steps of providing a semiconductor substrate having a column and row directions, then subsequently forming a first dielectric layer on the substrate. After that, the first dielectric layer is patterned for forming a plurality of source/drain contact openings and a plurality of word line trenches, wherein the word line trenches are parallel to the column direction. A doped conductive layer is formed in the source/drain contact openings and the word line trenches to form a plurality of source/drain contact plugs and a plurality of first word lines, respectively. The first word lines are removed to expose the substrate. A thermal oxidation is patterned to form a gate oxide layer on the exposed substrate and to form a source/drain region at the interface between the source/drain contact plugs and substrate. A first conductive layer is formed on the gate oxide layer within the word line trenches to form a plurality of second word lines, wherein the second word lines are smaller in height than the word line trenches. A first insulation layer is formed on the substrate. A second dielectric layer is formed on the first insulation layer. The first insulation layer and second dielectric layer are patterned to form a plurality of bit line trenches and a capacitor contact opening, wherein the bit line trenches are parallel to the row direction, and the bit line trenches and capacitor contact opening expose the corresponding source/drain contact plugs. A second conductive layer is formed in the bit line trenches and capacitor contact opening to form a plurality of bit lines and a capacitor contact plug, respectively. Parts of the bit lines is then removed so that the bit lines are smaller in height than the bit line trenches. Thereafter, a second insulation layer is formed on the substrate and fills the bit line trenches.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

FIGS. 3A to 3H are schematic, top views showing the process steps of one preferred embodiment of the method for manufacturing DRAM. FIGS. 4A to 4D are schematic, cross-sectional views along line I—I in FIGS. 3A to 3D, respectively, showing the process steps. FIGS. 4E to 4H are schematic, cross-sectional views showing the process steps along line II—II in FIGS. 3E to 3G. FIGS. 5E to 5H are schematic, crosssectional views showing the process steps along line III—III in FIGS. 3E to 3G.

Figure 1:
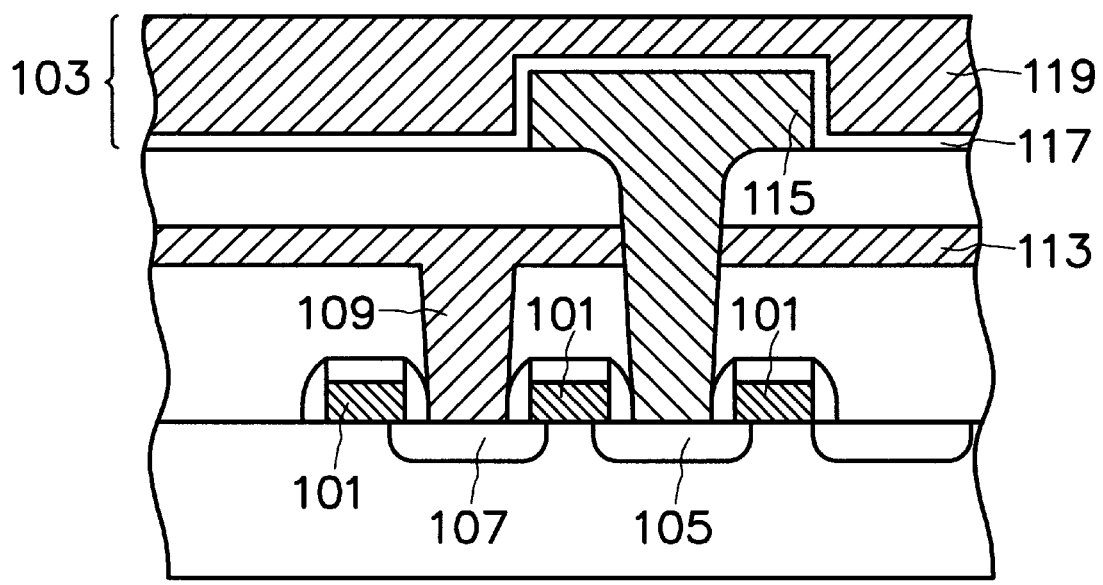
FIG. 1 is a schematic, cross-sectional view showing a DRAM cell.
Figure 2A:
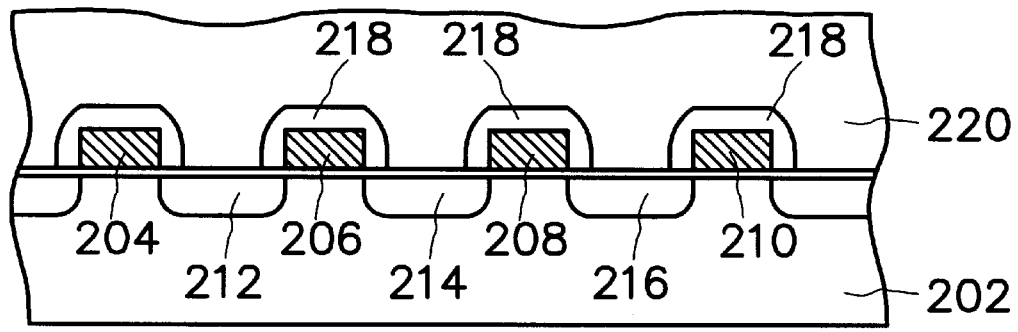
FIGS. 2A to 2D are schematic, cross-sectional views showing the conventional method for manufacturing capacitor of DRAM.
Figure 2B:
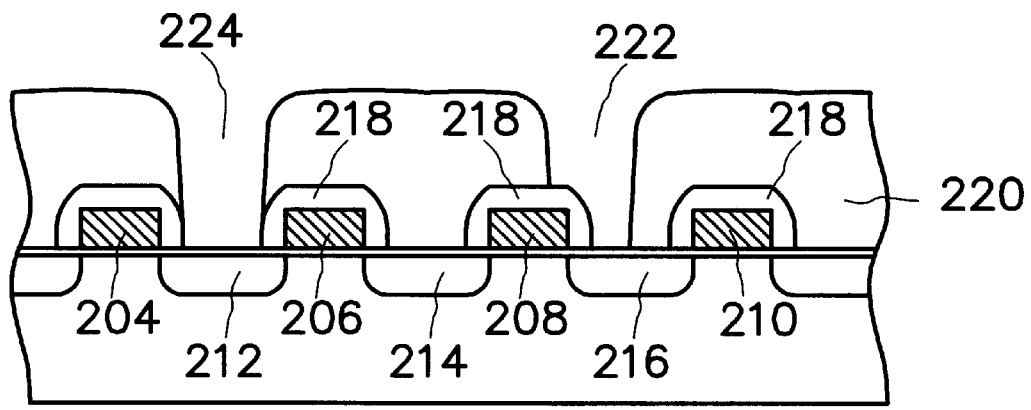
Figure 2C:
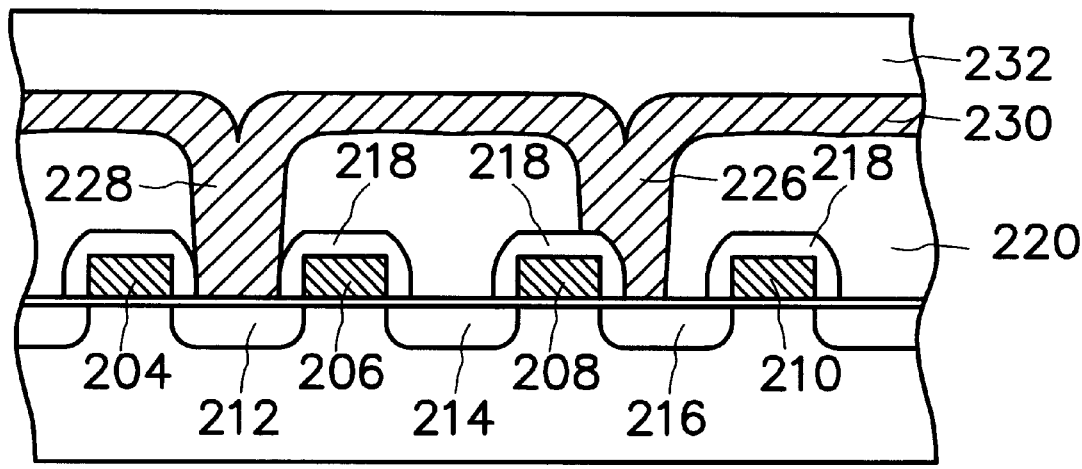
Figure 2D:
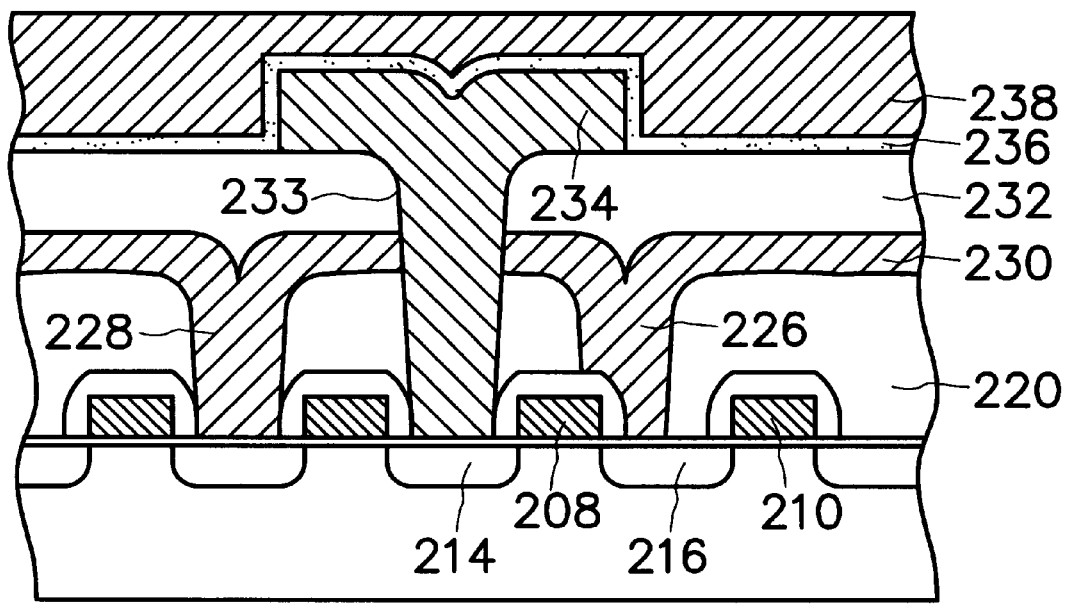
Figure 3A:
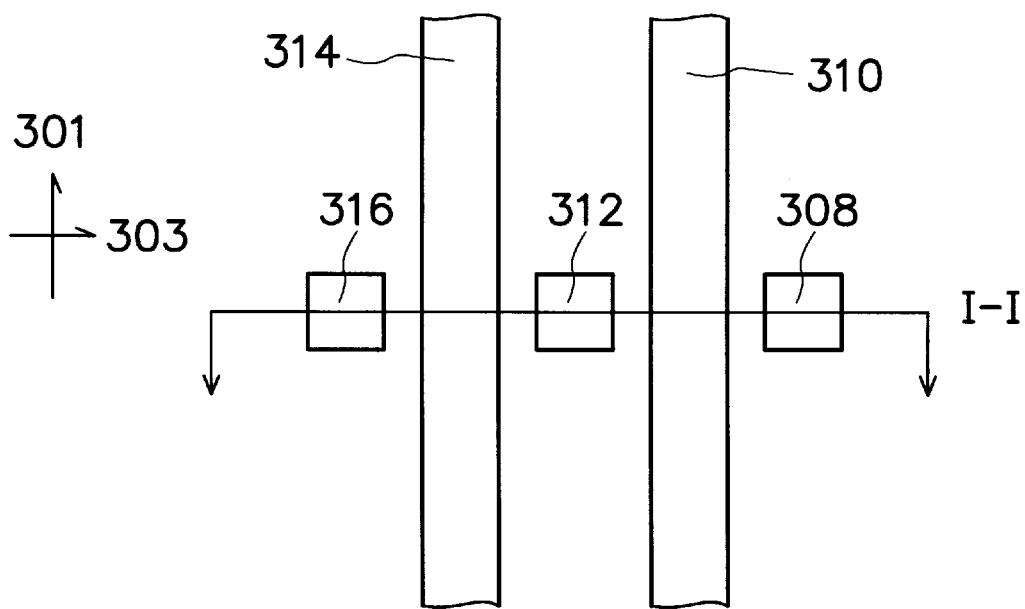
FIGS. 3A to 3H are schematic, top views showing the process steps of one preferred embodiment of the method for manufacturing DRAM.
Figure 4A:
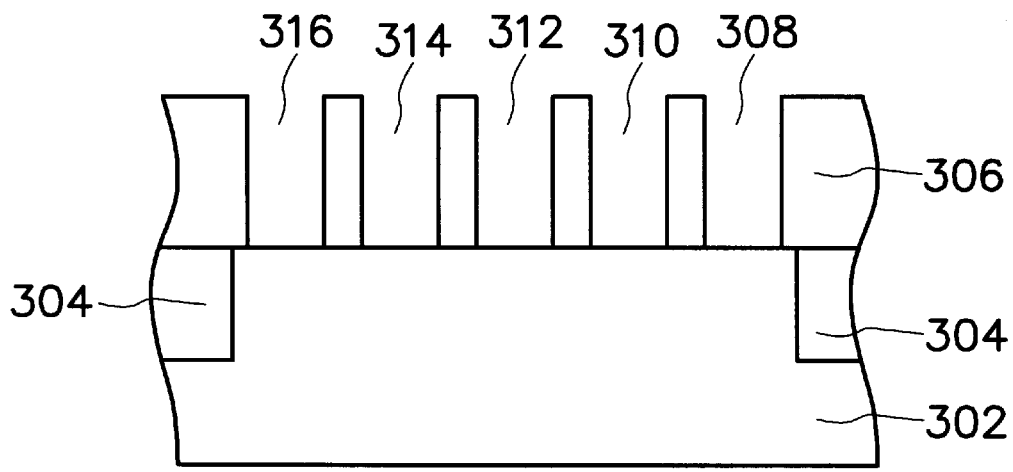
FIGS. 4A to 4D are schematic, cross-sectional views showing the process steps along line I—I in FIGS. 3A to 3D, respectively.

Referring to FIGS. 3A and 4A, a device isolation structure 304, for example, a shallow trench structure for isolation, is formed on the surface of the substrate 302, for example, a silicon substrate. An inter-poly dielectric layer 306, for example, a silicon oxide layer, is then formed on the substrate 302, preferably deposited by a low-pressure chemical vapor deposition, to a thickness of from about 1000 Å to 3000Å.

The dielectric layer 306 is then patterned to form word line trenches 310 and 314 and source/drain contact openings 308, 312 and 316 by, for example, conventional photolithography and etching steps, preferably using an anisotropic etching process to remove parts of the dielectric layer 306. Both the trenches 310 and 314 are aligned to axis 301 (column direction).

Figure 3B:
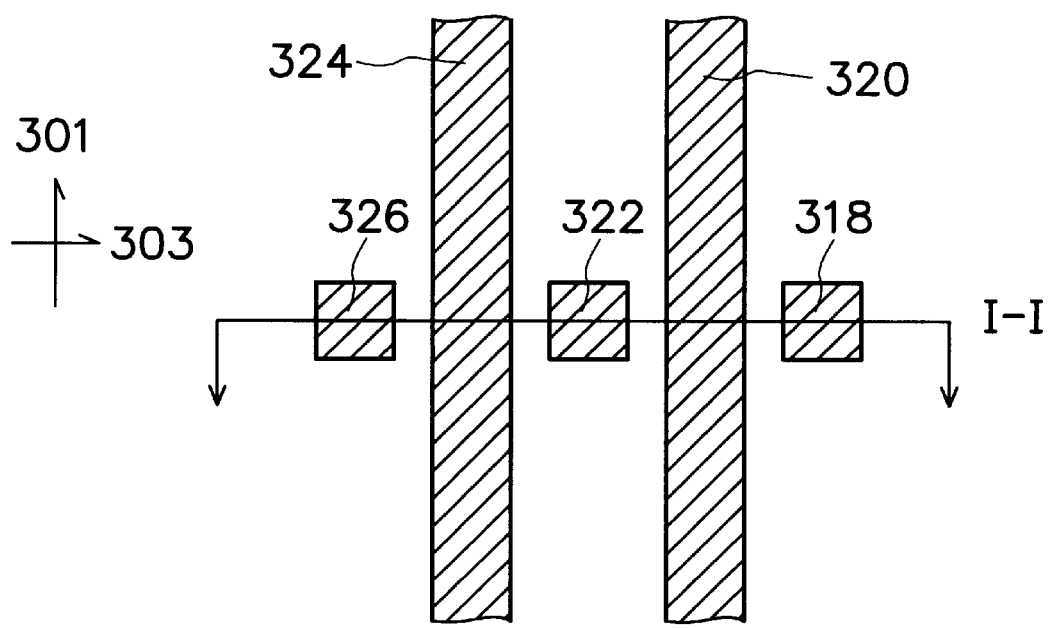
Figure 4B:
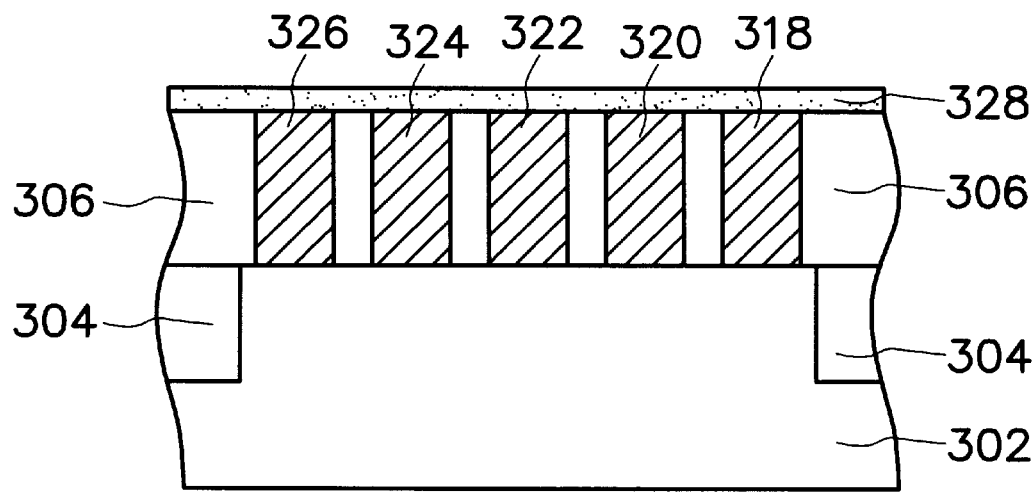

Referring to FIGS. 3B and 4B, the trenches 310 and 314 and contact openings 308, 312 and 316 are then filled with a layer of conductive material to form word lines 320 and 324, which act as gate electrodes, in the trenches 310 and 314 and to form contact plugs 318, 322 and 326 in the contact openings 308, 312 and 316. The layer of conductive material, preferably a polysilicon layer, is formed by deposition, such as low pressure chemical vapor deposition (LPCVD) using $SiH_4$ as a reactant gas. Dopants, for example, phosphorus, are doped in the deposition process of the polysilicon layer to form a doped polysilicon layer. The doped polysilicon layer is then etched back to form word lines 320 and 324 and contact plugs 318, 322 and 326 by using the dielectric layer 306 as an etching end point. An insulation layer 328, for example, a silicon nitride layer ($SiN_3$), is then formed over the substrate 302 by a process such as a plasma enhanced chemical vapor deposition (PECVD) to a thickness of from about 100 Å to 250 Å.

Figure 3C:
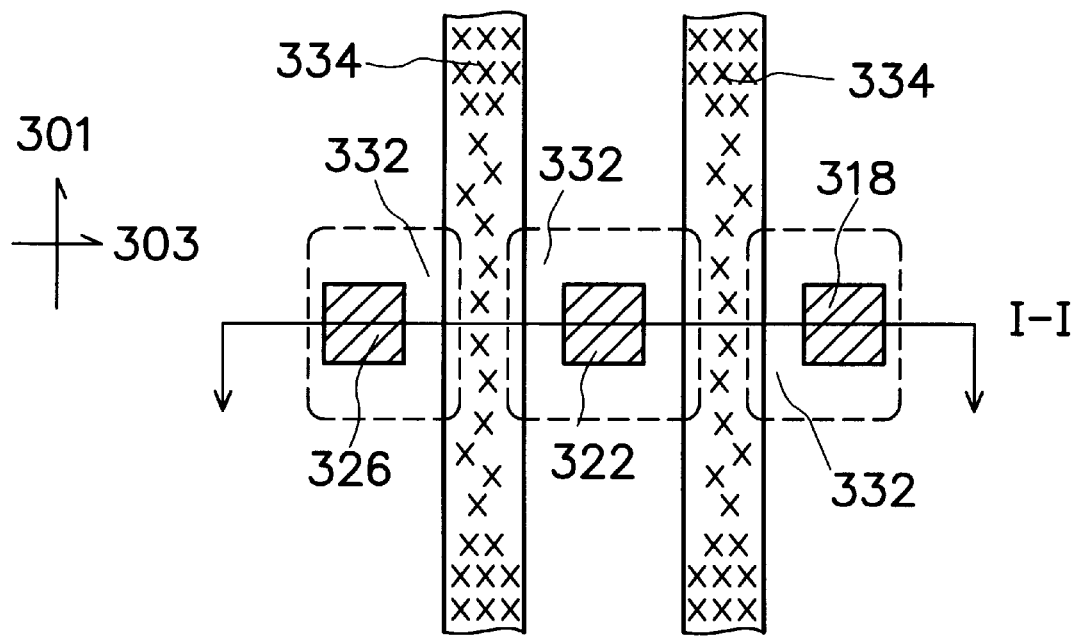
Figure 4C:
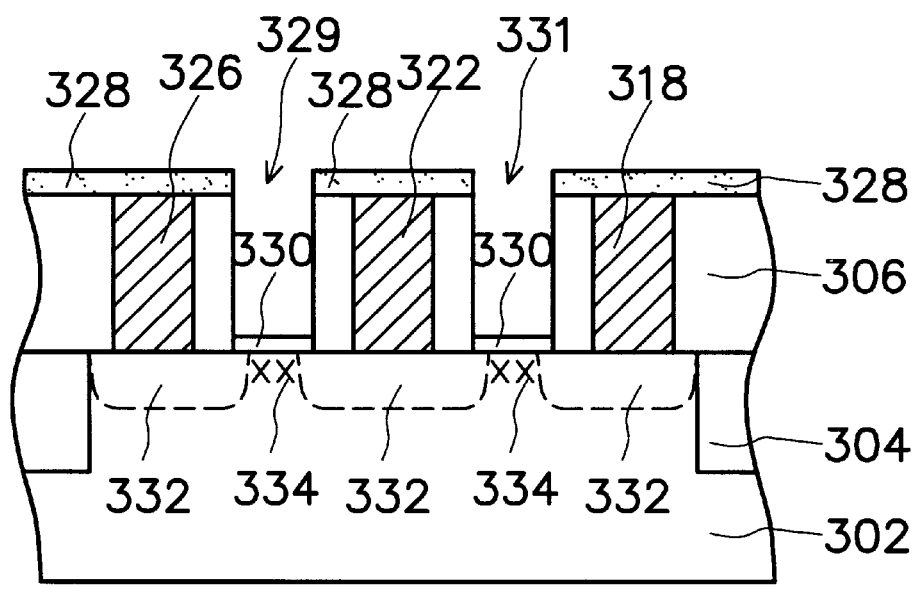

Referring to FIGS. 3C and 4C, parts of the insulation layer 328 positioned directly above the word lines 320 and 324 are removed in sequence to expose the substrate 302 and to form openings 329 and 331 in the insulation layer 328 with respect to the trenches 310 and 314 by performing photolithography and etching steps on the insulation layer 328. Performing an anisotropic process and using the insulation layer 328 as a mask, the word lines 320 and 324 positioned in the openings 329 and 331 are removed to expose partial surfaces of the substrate 302. A thermal oxidation process, for example, dry oxidation performed in a furnace, is then used to form a gate oxide layer 330 on the exposed substrate 302 to a thickness of from about 100 Å to 250 Å. Additional steps can be employed before the formation step of the gate oxide layer 330. For example, a sacrificial oxide layer (not shown) can be formed followed by doping the substrate 302 positioned within the trenches 310 and 314 with boron or phosphorus ions to form a doping channel region 334 for adjusting the threshold voltage. Thereafter, the sacrificial oxide layer is then removed. Moreover, the dopants in the contact plugs 318, 322 and 326 are further diffused into the substrate 302 to form source/drain regions 332 during the thermal oxidation process.

Figure 3D:
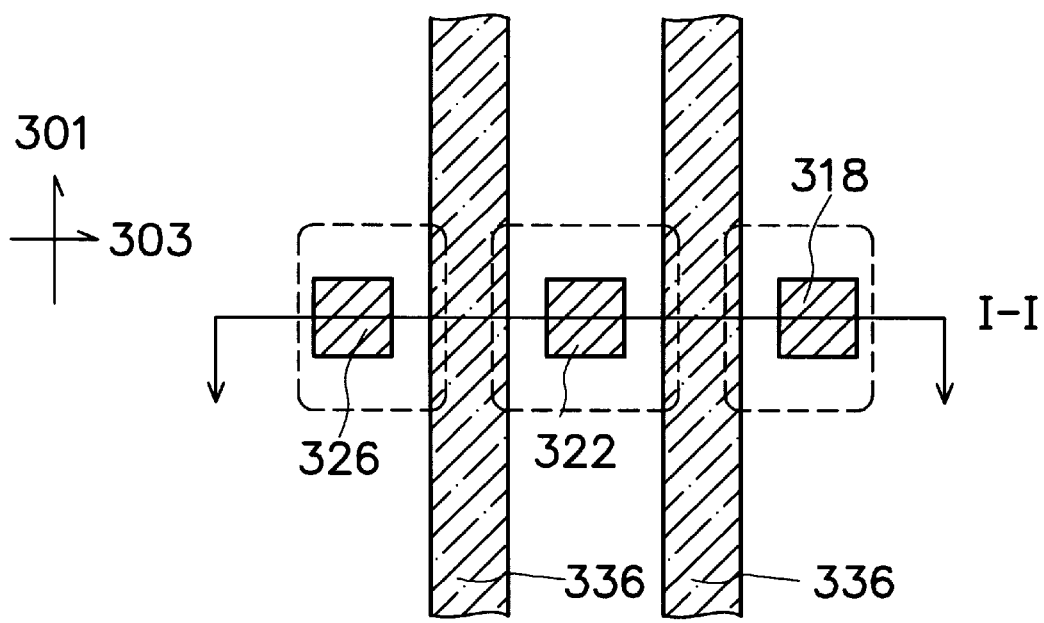
Figure 4D:
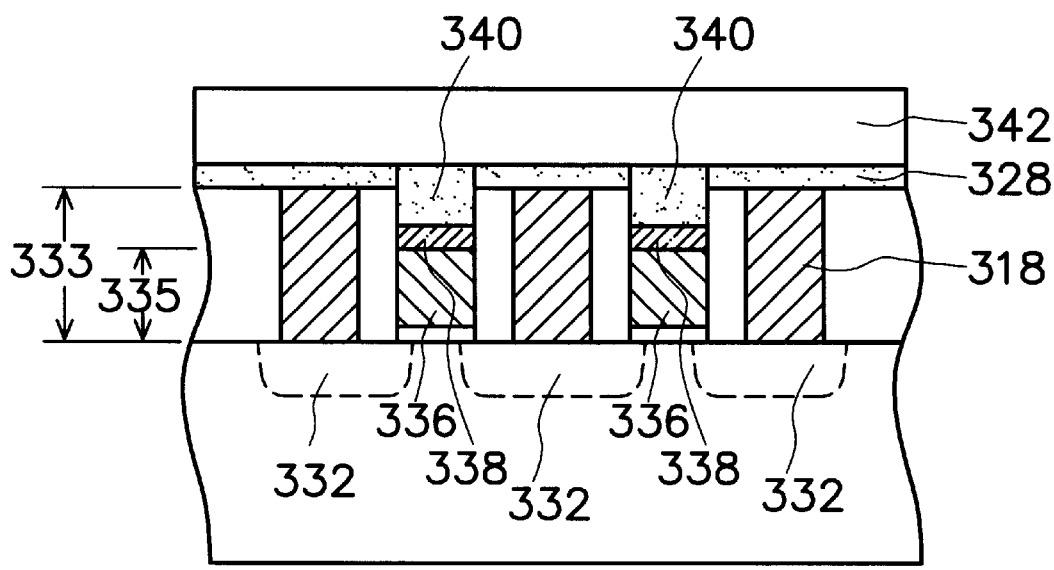

Referring to FIGS. 3D and 4D, word lines 336, preferably composed of polysiliocn, are then formed in the trenches 310 and 314. The height 335 of the word lines 336 is somewhat less than the depth 333 of the trenches 310 and 314. The word lines 336 are formed by depositing a polysilicon layer followed by an etching back step. The depositing method of the polysilicon layer includes, such as low pressure chemical vapor deposition using $SiH_4$ as a reactant gas. Dopants, for example, phosphorus, can be doped into the polyslicon layer to form a doped polysilicon layer. A silicide layer 338, preferably a tungsten silicide layer, can be formed on the surface of the word line 336 for increasing conductivity by, such as a low pressure chemical vapor deposition to a thickness of from about 100 Å to 200 Å. An insulation layer 340 is then formed on the entire surface of the substrate 302. An etching back step is then applied on the insulation layer 340 to planarize the surface by utilizing the insulation layer 328 as an etching end point. For example, a silicon nitride layer 340 is formed on the substrate 302 by a plasma enhanced chemical vapor deposition. The silicon nitride layer 304 is then chemically-mechanically polished to planarize the surface, with the insulation layer 328 serving as an etching end point.

The manufacturing processes of the transistor are described above. The fabricating processes for forming bit line and capacitor on the transistor are described as below.

Referring to FIGS. 3D and 4D, a dielectric layer 342, such as a silicon oxide layer, is then formed on the substrate 302 by deposition, such as atmospheric pressure chemical vapor deposition (APCVD) to a thickness of from about 1000 Å to 6000 Å.

Figure 3E:
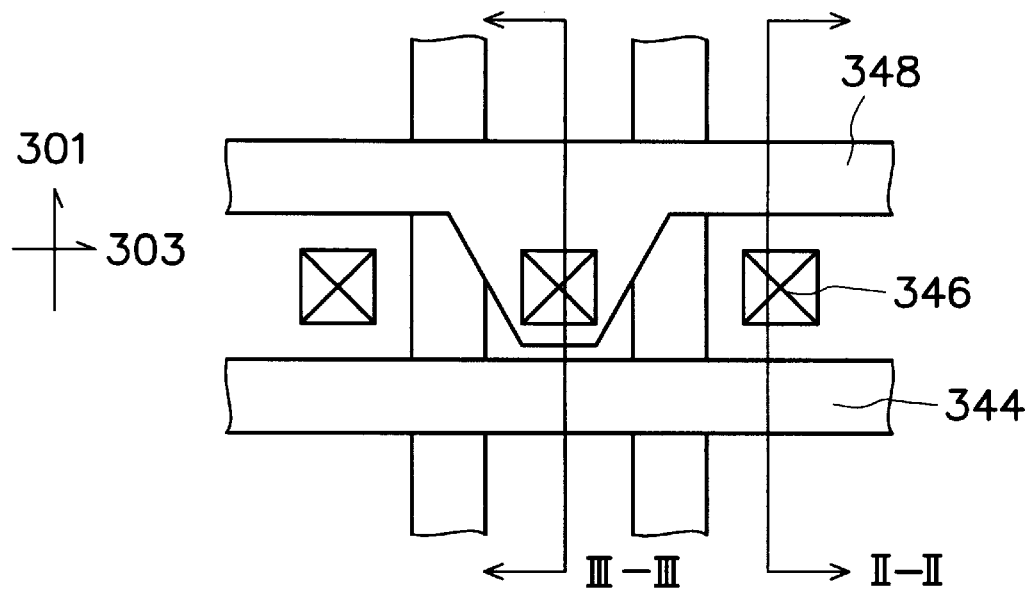
Figure 4E:
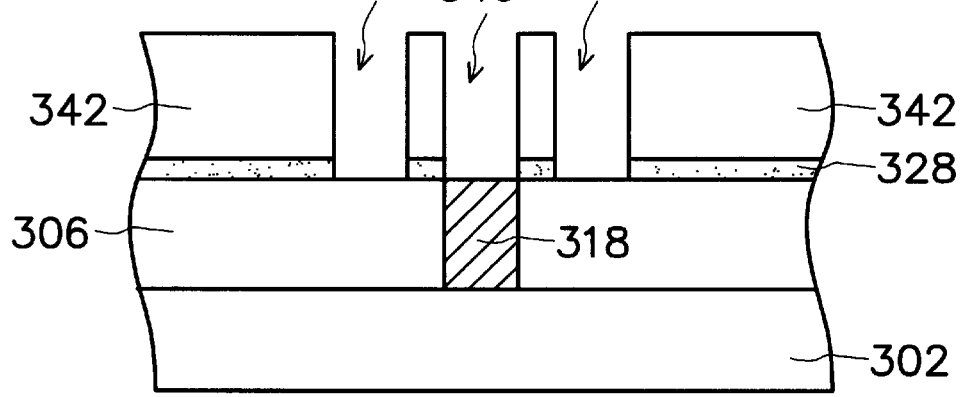
FIGS. 4E to 4H are schematic, cross-sectional views showing the process steps along line II—II in FIGS. 3E to 3G.
Figure 5E:
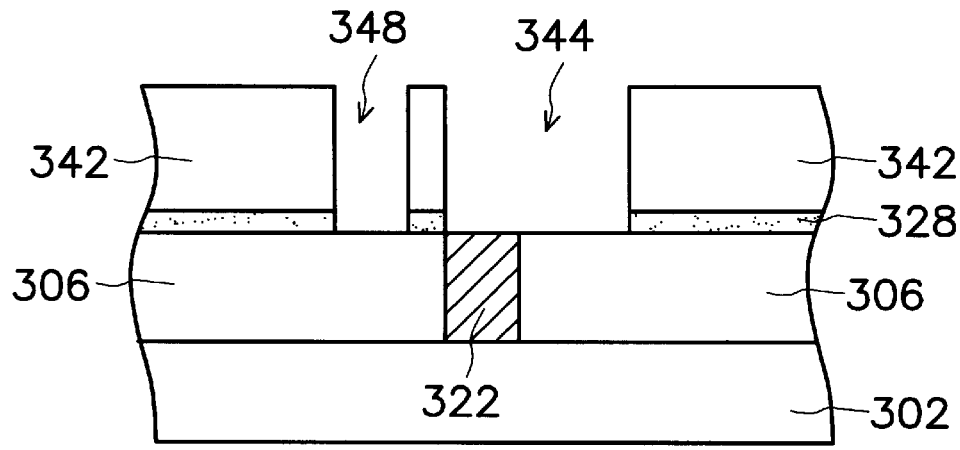
FIGS. 5E to 5H are schematic, cross-sectional views showing the process steps along line III—III in FIGS. 3E to 3G.

Referring to FIGS. 3E, 4E and 5E, the dielectric layer 3432 and insulation layer 328 are patterned to form trenches 344 and 348 for bit lines and contact opening 346 for the capacitor. The trenches 344 and 348 are placed parallel to axis 303 (Row direction). The patterning step is performed by, for example, using a conventional photolithography and etching procedures, preferably an anisotropic etching process, for removing parts of the dielectric layer 342 and insulation layer 328 to form the trenches 344, 348 and contact opening 346. The trenches 344 and 348 are perpendicular to the word line 336. The bottom of the contact opening 346 and trenches 344 and 348 expose the surface of the contact plugs 318 and 322, respectively.

Figure 3F:
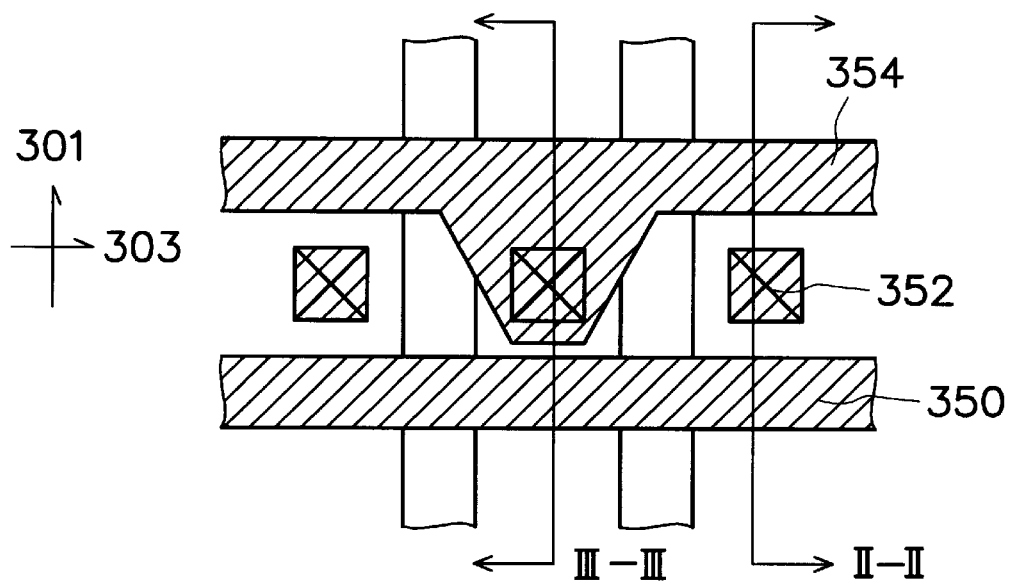
Figure 4F:
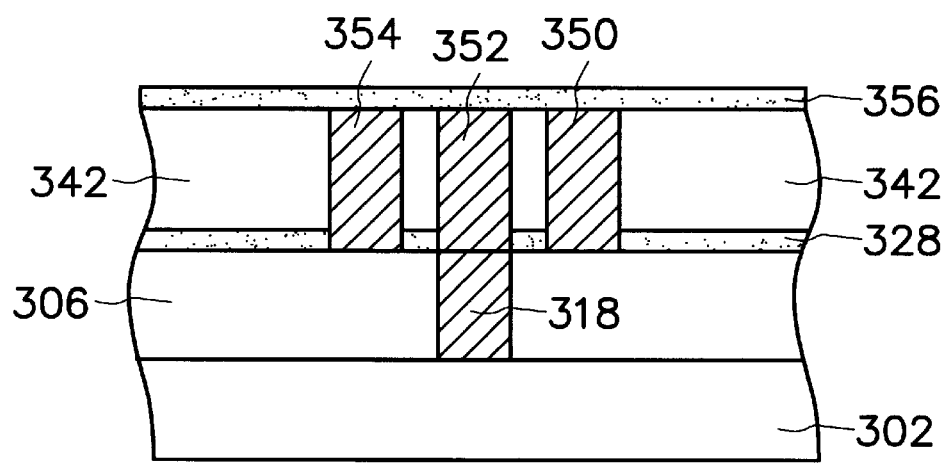
Figure 5F:
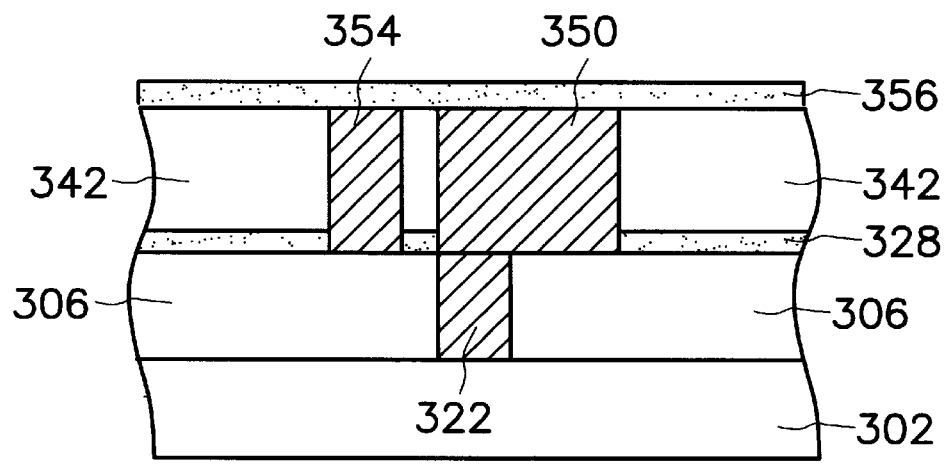

Referring to FIGS. 3F, 4F and 5F, the trenches 344 and 348 and contact opening 346 are filled with a layer of conductive material to form bit lines 350 and 354 in the trenches 344 and 348 and to form capacitor contact plugs 352 in the contact trench 346. The bit lines 350 and 354 and contact plugs 352, composed of polysilicon or doped polysilicon are formed by, for example, using a low pressure chemical vapor deposition to form a doped polysilicon layer followed by performing an etching back process and using the dielectric layer 342 as etching end point. The contact plugs 352 and bit lines 350 and 354 electrically contact the contact plugs 318 and 322, respectively.

Figure 3G:
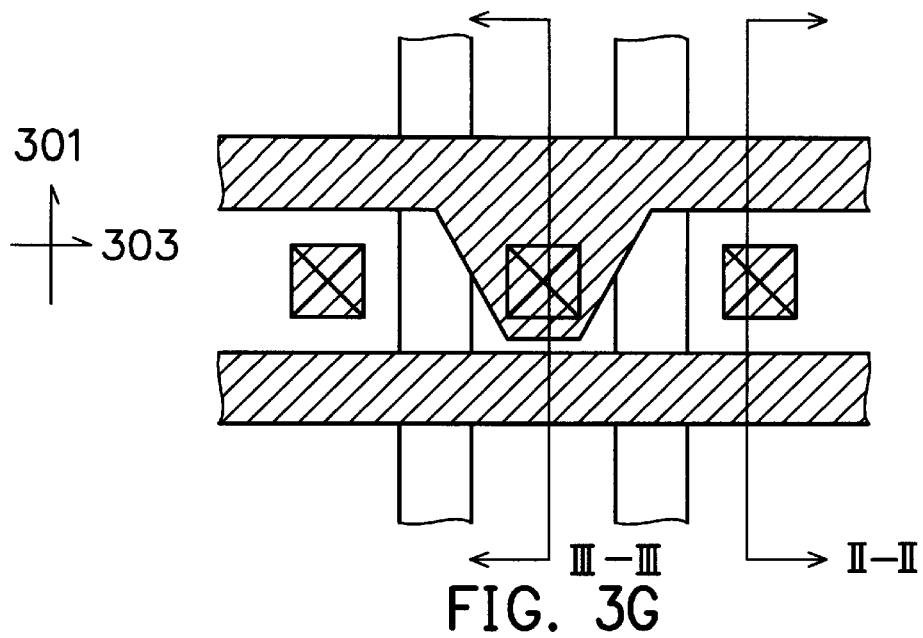
Figure 4G:
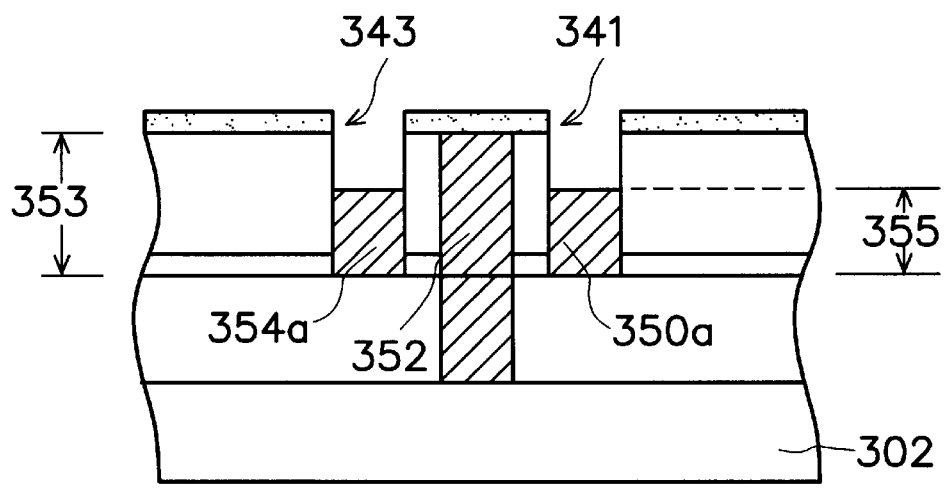
Figure 5G:
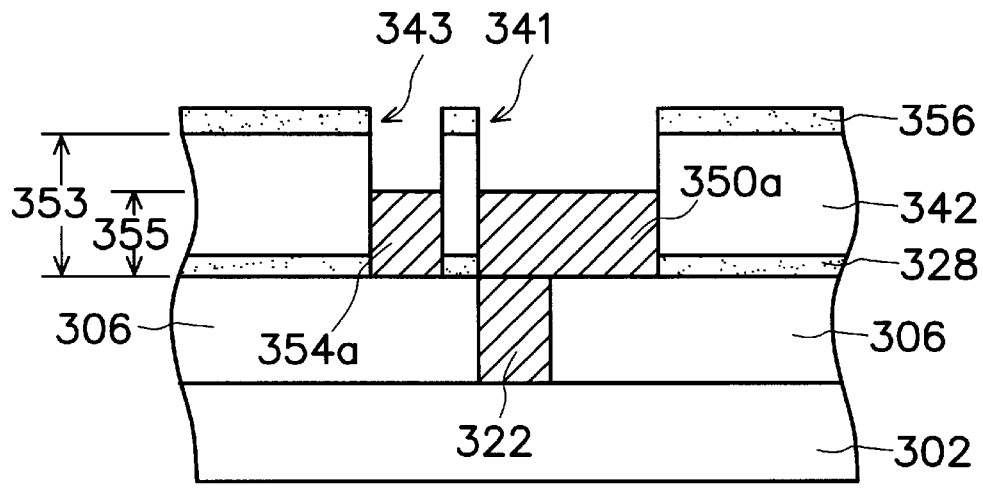

Referring to FIGS. 3G, 4G and 5G, an insulation layer 358, composed of silicon nitride, is formed on the substrate 302 by, for example, an atmosphere pressure chemical vapor deposition to a thickness of from about 100 Å to 250 Å. Photolithography and etching procedures are used to pattern and remove parts of the insulation layer 356 positioned directly above the bit lines 350 and 354 for exposing the bit lines 350 and 354. For example, the silicon nitride layer 356 is patterned to form openings 341 and 343 for exposing the bit lines 350 and 354. The silicon nitride layer 356 is then used as a mask to etch the bit lines 350 and 354 within the openings 341 and 343 so that bit lines 350a and 354a are formed, respectively. The height 355 of the bit lines 350a and 354a is somewhat less than the height 353 of the trenches 344 and 348.

Figure 3H:
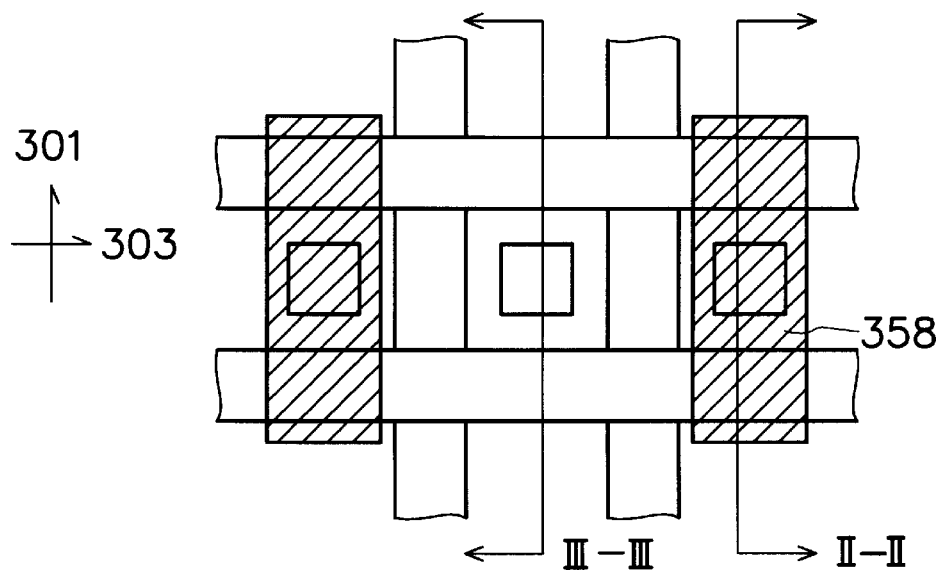
Figure 4H:
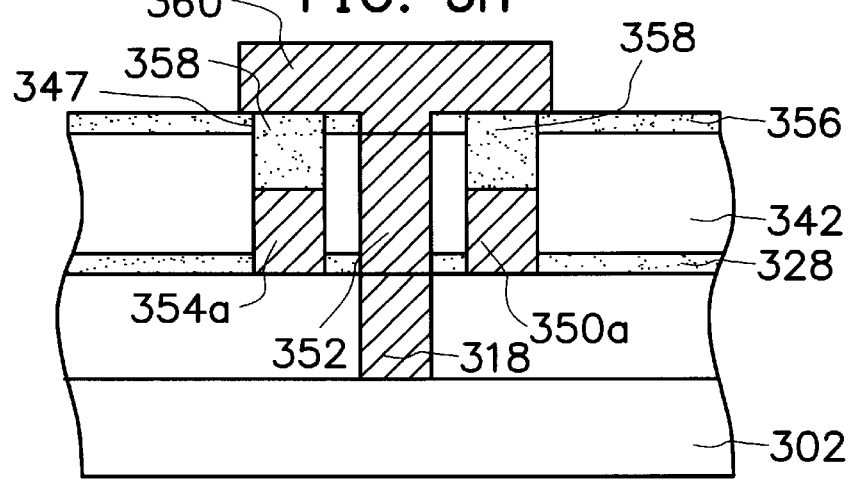
Figure 5H:
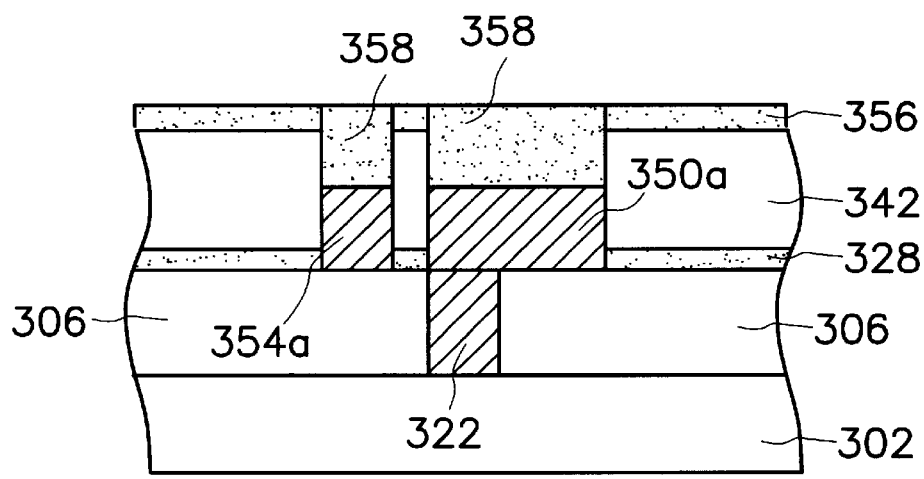
Figure 6:
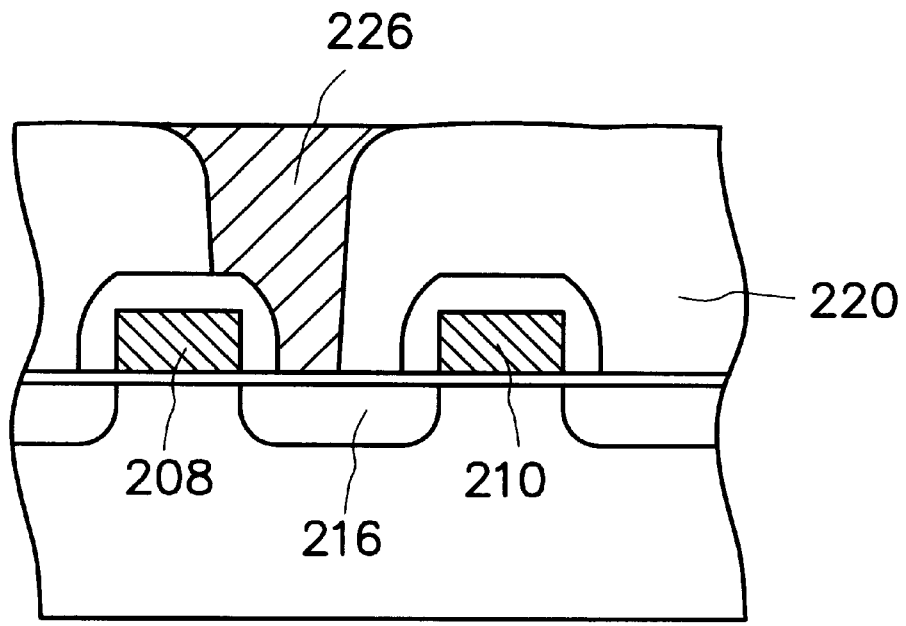
FIG. 6 is schematic, cross-sectional view showing an enlargement of parts shown in FIG. 2D.
Figure 7:
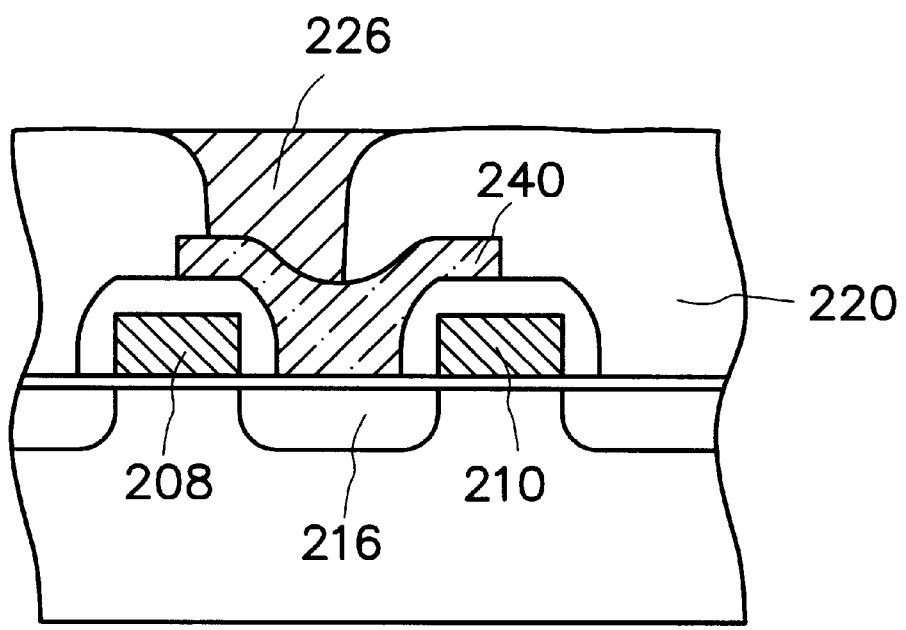
FIG. 7 is schematic, cross-sectional view showing the conventional poly pad.

Referring to FIGS. 3H, 4H and 5H, an insulation layer 358 is formed over the entire substrate 302. The insulation layer 358 is then etched back. For example, a silicon nitride layer is formed by a chemical vapor deposition and used as an insulation layer 358. Thereafter, the insulation layer 358 is chemically-mechanically polished with the insulation layer 356 serving as an etching end point. Subsequent processes for forming capacitors are further performed. For example, the insulation layer 356 is patterned for forming an opening positioned corresponding to conduct plug 352. Thereafter, a conductive layer 360 is then formed, electrically connecting the substrate 302 and conduct plug 352. Subsequent photolithography is then applied on the conductive layer 360 for forming a bottom electrode of the capacitor. These processes are not especially related to the features of the invention, so detailed description of the subsequent processes for manufacturing DRAM is omitted.

One advantage of the present invention is that of preventing the problem of misalignment by forming a contact opening and gate in the same process. Therefore, it is not necessary to perform the complex processes of the conventional method. In other words, the poly pad used in the conventional method is not utilized in the present invention. Furthermore, the memory cell and logic circuit regions have the same height in the entire forming steps of the memory cell. Moreover, dopants are thermally diffused into the substrate to form source/drain regions in the oxidation step of the doped polysilicon plug. Therefore, the manufacturing procedure is simplified.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A fully self-aligned method for fabricating a transistor, comprising the steps of:

providing a semiconductor substrate;

forming a first dielectric layer on the substrate;

simultaneously forming a plurality of source/drain region contact openings and word line trenches on the first dielectric layer by patterning the first dielectric layer;

forming a doped conductive layer in the source/drain contact openings and word line trenches to form a plurality of source/drain conduct plugs and first gate conductive layers, respectively;

removing the first gate conductive layers to expose the substrate;

performing a thermal oxidation to form a gate oxide layer on the exposed substrate and to form a plurality of source/drain regions at the interface between the source/drain contact openings and substrate;

forming a second conductive layer in the word line trenches to form a plurality of second gate conductive layers on the gate oxide layer, wherein the second gate conductive layers have a height less than a depth of the word line trenches; and forming an insulation layer on the substrate and filling the word line trenches.

2. A method according to claim 1, wherein the material of the first dielectric layer includes silicon oxide.

3. A method according to claim 1, wherein the material of the first doped conductive layer includes doped polysilicon.

4. A method according to claim 1, wherein the step of removing the first gate conductive layers, comprising:
   forming a silicon nitride layer on the substrate;
   patterning the silicon nitride layer to form a plurality of openings positioned corresponding to the word line trenches; and
   using the silicon nitride layer as a mask to remove the first gate conductive layer in the openings to expose the substrate.

5. A method according to claim 1, wherein the material of the second conductive layer includes polysilicon.

6. A method according to claim 1, wherein the source/drain regions is formed by the thermally oxidation for thermal diffusing the dopants in the source/drain conduct plugs to the substrate.

7. A method according to claim 1, wherein between the steps of removing the first gate conductive layers and performing the thermal oxidation, further comprises the step of performing a channel doping step on the exposed substrate.

8. A method according to claim 1, wherein the material of the first doped conductive layer and the second conductive layer is doped polysilicon.

9. A fully self-aligned method for fabricating memory, comprising the steps of:
   providing a semiconductor substrate having a column and row directions;
   forming a first dielectric layer on the substrate;
   patterning the first dielectric layer for forming a plurality of source/drain contact openings and a plurality of word line trenches, wherein the word line trenches are placed parallel to the column direction;
   forming a doped conductive layer in the source/drain contact openings and the word line trenches to form a plurality of source/drain contact plugs and a plurality of first word lines, respectively;
   removing the first word lines to expose the substrate;
   performing a thermal oxidation to form a gate oxide layer on the exposed substrate and to form a source/drain region at the interface between the source/drain contact plugs and substrate;
   forming a first conductive layer on the gate oxide layer within the word line trenches to form a plurality of second word lines, wherein the second word lines are smaller in height than the word line trenches;
   forming and planarizing a first insulation layer on the substrate;
   forming a second dielectric layer on the first insulation layer;
   patterning the first insulation layer and second dielectric layer to form a plurality of bit line trenches and a capacitor contact opening, wherein the bit line trenches are placed parallel to the row direction, and the bit line trenches and capacitor contact opening expose the corresponded source/drain contact plugs;
   forming a second conductive layer in the bit line trenches and capacitor contact opening to form a plurality of bit lines and a capacitor contact plug, respectively;
   removing parts of the bit lines so that the bit lines are shorter in height than the bit line trenches; and
   forming a second insulation layer on the substrate and filling the bit line trenches.

10. A method according to claim 9, wherein the step of removing the first word lines further includes the steps of:
    forming a silicon nitride layer on the substrate;
    patterning the silicon nitride layer to form a plurality of first openings positioned directly above the word lines trenches; and
    removing the first word lines within the first openings to expose the substrate by using the silicon nitride as a mask.

11. A method according to claim 9, wherein the step of removing parts of the bit lines so that the bit lines are smaller in height than the bit line trenches further includes the steps of:
    forming a silicon nitride layer on the substrate;
    patterning the silicon nitride to form a plurality of second openings positioned directly above the bit line trenches;
    removing parts of the bit lines within the second openings so that the bit lines are smaller in height than the bit line trenches.

12. A method according to claim 9, wherein the material of the first and second dielectric layers includes silicon oxide.

13. A method according to claim 9, wherein the material of the first and second conductive layers and the doped conductive layer includes doped polysilicon.

14. A method according to claim 9, wherein the source/drain regions are formed by the thermal oxidation for diffusing the dopants in the source/drain contact plugs into the substrate.

15. A method according to claim 9, wherein between the steps of forming the second word lines and first insulation layer, further includes the step of forming a silicide layer on the second word lines.

16. A method according to claim 9, wherein between the steps of removing the parts of the bit lines and forming the second insulation layer, further includes the step of forming a silicide layer on the bit lines.

17. A method according to claim 9, wherein further comprising the steps of forming a capacitor on the second insulation layer, wherein a bottom electrode of the capacitor is electrically connected to the capacitor plug.

18. A method according to claim 9, wherein the material of the first and second insulation layer includes silicon nitride.

19. A method according to claim 9, wherein between the steps of removing the first word lines and performing the thermal oxidation, further comprises the step of performing a channel doping step on the exposed substrate.

* * * * *